(12) United States Patent
Martin et al.

(10) Patent No.: US 10,317,244 B2
(45) Date of Patent: Jun. 11, 2019

(54) SYSTEM FOR ACQUISITION OF AT LEAST ONE PHYSICAL VARIABLE, IN PARTICULAR FOR A CRITICAL ON-BOARD AVIONICS SYSTEM, AND ASSOCIATED ACQUISITION METHOD

(71) Applicant: THALES, Courbevoie (FR)

(72) Inventors: Romain Martin, Pessac (FR); Olivier Guerineau, Pessac (FR); Guillaume Terrasson, Bidart (FR); Renaud Briand, Serres-Castet (FR); Marc Gatti, Pessac (FR)

(73) Assignee: THALES, Courbevoie (FR)

( * ) Notice: Subject to any disclaimer, the term of this patent is extended or adjusted under 35 U.S.C. 154(b) by 0 days.

(21) Appl. No.: 15/315,069

(22) PCT Filed: Jun. 3, 2015

(86) PCT No.: PCT/EP2015/062396
§ 371 (c)(1),
(2) Date: Nov. 30, 2016

(87) PCT Pub. No.: WO2015/185637
PCT Pub. Date: Dec. 10, 2015

(65) Prior Publication Data
US 2017/0199055 A1    Jul. 13, 2017

(30) Foreign Application Priority Data
Jun. 3, 2014    (FR) ..................................... 14 01273

(51) Int. Cl.
*G01D 3/08*    (2006.01)
*H03M 1/06*    (2006.01)
(Continued)

(52) U.S. Cl.
CPC ................. *G01D 3/08* (2013.01); *H03M 1/06* (2013.01); *H03M 1/1009* (2013.01); *H03M 1/1076* (2013.01); *H03M 1/12* (2013.01)

(58) Field of Classification Search
CPC .............................. H03M 1/06; H03M 1/1009
(Continued)

(56) References Cited

U.S. PATENT DOCUMENTS

2010/0149007 A1 * 6/2010 Zushi .................. H03M 1/1028
                                                             341/120
2011/0241913 A1    10/2011 Ikeda et al.

FOREIGN PATENT DOCUMENTS

DE          19705406 A1      8/1998
EP          1211485 A1 *     6/2002      ............... G01D 3/08
(Continued)

OTHER PUBLICATIONS

International Search Report dated Aug. 12, 2015 issued in corresponding PCT International Application No. PCT/EP2015/062396.
(Continued)

*Primary Examiner* — Maceeh Anwari
(74) *Attorney, Agent, or Firm* — Troutman Sanders LLP (57) ABSTRACT

The present invention relates to a system for acquisition of at least one physical variable, in particular for a critical on-board avionics system, comprising a sensor for measuring the physical variable; an acquisition channel receiving an analog signal corresponding to the physical variable measured by the sensor and transforming this analog signal into a corresponding digital signal, at least some of these transformations being able to be carried out with loss of accuracy; self-test unit for checking the integrity of the acquisition channel and generating a self-test result. The system further comprises an analyzer analyzing the self-test result in order to determine an operating mode of the
(Continued)

acquisition channel, and for activating the operation of means for correcting the signal delivered by the channel.

17 Claims, 4 Drawing Sheets

(51) Int. Cl.
  *H03M 1/10* (2006.01)
  *H03M 1/12* (2006.01)
(58) Field of Classification Search
  USPC .......................................................... 701/30.2
  See application file for complete search history.

(56) References Cited

FOREIGN PATENT DOCUMENTS

EP  1211485 A1  6/2002
JP  S57152219 A  9/1982

OTHER PUBLICATIONS

French Search Report dated Feb. 5, 2015 issued in corresponding French Application No. 1401273.

\* cited by examiner

SYSTEM FOR ACQUISITION OF AT LEAST ONE PHYSICAL VARIABLE, IN PARTICULAR FOR A CRITICAL ON-BOARD AVIONICS SYSTEM, AND ASSOCIATED ACQUISITION METHOD

CROSS-REFERENCE TO RELATED APPLICATIONS

This is a U.S. national phase application under 35 U.S.C. § 371 of International Patent Application No. PCT/EP2015/062396, filed Jun. 3, 2015, and claims benefit of priority to French Patent Application No. 1401273, filed Jun. 3, 2014. The entire contents of these applications are hereby incorporated by reference.

TECHNICAL FIELD

The present invention relates to a system for acquisition of at least one physical variable, in particular for a critical on-board avionics system.

More specifically, the invention relates to such an acquisition system, of the type including:
- at least one sensor for measuring the physical variable;
- at least one acquisition channel receiving an analog signal corresponding to the physical variable measured by the sensor and transforming this analog signal into a corresponding digital signal, at least some of these transformations being able to be carried out with loss of accuracy;
- self-test means for checking the integrity of the acquisition channel and generating a self-test result.

The present invention also relates to an acquisition method associated with this acquisition system.

BACKGROUND

Such an acquisition system for example includes a sensor for measuring at least one physical variable, for example the position, speed, ambient temperature, pressure or humidity.

The measured physical variable is transmitted to the acquisition system for example in the form of an electrical resistance, or more generally in the form of an analog signal.

The acquisition system then makes it possible to transform this analog signal into a digital signal that can next be processed by a suitable digital processing means and optionally be communicated to an operator.

Thus, the acquisition systems are usable in many technical fields.

This is particularly the case for on-board avionics systems for example making it possible to measure the temperature outside the aircraft using a suitable sensor.

The operation of such acquisition systems must therefore meet a certain level of criticality or safety generally imposed by aeronautics standards based on the significance of the applied physical variable and/or its influence on the piloting of the aircraft.

Thus, for example, aeronautics standards ARP 4754A, ED-12C and DO-178C define five levels of criticality (from A to E) or DAL (Design Assurance Level) for avionics systems. The DAL A level has the highest criticality level and is assigned to avionics systems whereof an operating defect may cause a catastrophic event in the aeronautics sense of the term (loss of human life).

The DAL A level is for example assigned to various acquisition systems usable in DAL A avionics systems. This requires many constraints regarding the operating safety of these systems. One can then see that development, production and operating costs for the systems become increasingly high with the increase in the number of these constraints.

Thus, to decrease these costs while retaining the overall DAL A criticality level of the avionics system, it is known to use several redundant acquisition systems with a lower criticality level, for example DAL B. Different voting systems may next be applied by the avionics system to choose the majority value from among all of the values delivered by these redundant acquisition systems.

Furthermore, to avoid aging of these systems, their criticality level is often oversized in production, which makes it possible to ensure their proper operation over the entire operating period despite any aging.

One can then see that this results in a certain number of drawbacks, which include electricity consumption, bulk, complexity, weight and high costs of these acquisition systems.

Furthermore, the existing acquisition systems often have limited abilities to detect flaws in their operation and make it possible to detect only sudden flaws of the straightforward failure type.

SUMMARY

The present invention aims to provide an acquisition system resolving these drawbacks and having higher capacities for detecting flaws in its operation.

To that end, the present invention relates to an acquisition system of the aforementioned type, further including means for analyzing the self-test result in order to determine a normal, downgraded or failure operating mode of the acquisition channel, and for activating the operation of means for correcting the digital signal delivered by the channel when the latter is in the downgraded operating mode.

According to other advantageous aspects of the invention, the acquisition system comprises one or more of the following features, considered alone or according to all technically possible combinations:
- in the normal operating mode, the values of the accuracy losses of the acquisition channel belong to a first predetermined value range;
- in the downgraded operating mode, the values of the accuracy losses of the acquisition channel belong to a second predetermined value range, each value of the second range being greater than each value of the first range and less than each value of a third predetermined value range;
- in the failure operating mode, the values of the accuracy losses of the acquisition channel belong to the third value range;
- the self-test means include a computing unit able to dynamically execute a reverse operating model of the acquisition channel, the reverse operating model being defined by a plurality of parameters and allowing the correction means to correct the digital signal delivered by the acquisition channel when the latter is in the downgraded operating mode;
- it is able to deliver at least one original digital signal corresponding to the digital signal delivered by the acquisition channel, a status signal generated by the analysis means and indicating the current operating mode of the acquisition channel, and a digital signal with compensation generated by the correction means and corresponding to the digital signal delivered by the acquisition channel and corrected by these correction means;

the self-test means further include a storage unit able to store a database including the parameters of the reverse operating model;

the parameters of the reverse operating model are computed dynamically;

the reverse operating model further makes it possible to compute, for a reference digital signal, a reference analog signal, to inject it into the acquisition channel;

the self-test means include a storage unit able to store a database including digital reference signals and analog reference signals, each digital reference signal being associated with an analog reference signal able to be injected into the acquisition channel;

the self-test means further include a unit for comparing a digital test signal delivered by the acquisition channel and corresponding to said analog reference signal injected into the acquisition channel, with said digital reference signal;

it further includes learning means able to calibrate the parameters of the reverse operating model, in the downgraded operating mode of the acquisition channel;

the correction means are able to correct the delivered digital signal, from parameters of the reverse operating model calibrated by the learning means;

the self-test means, the analysis means, the correction means and the learning means are integrated at least partially into a single component; and the single component is situated near the sensor.

The present invention also relates to a method for the acquisition of at least one physical variable, implemented by the acquisition system as defined, comprising an acquisition phase including the following steps:

the sensor measures a physical variable;

an analog signal corresponding to the measured physical variable is injected into the acquisition channel;

the acquisition channel converts the analog signal into a digital signal;

the digital signal is delivered.

According to other advantageous aspects of the invention, the acquisition method comprises one or more of the following features, considered alone or according to all technically possible combinations:

it further comprises a self-test phase including the following steps: a digital reference signal is developed; the reverse operation model converts the digital reference signal into an analog reference signal; this analog reference signal is injected into the acquisition channel; the acquisition channel converts this analog reference signal into a digital test signal; the comparison unit compares the additional test signal to the digital reference signal; and an operating mode of the acquisition channel is determined from among the normal, downgraded or failure operating modes;

it further comprises a learning phase including the following steps: the self-test phase is applied for a minimal digital reference signal and for a maximal digital reference signal to determine the losses of accuracy on each of these digital reference signals, and the learning means calibrate a new set of parameters for the reverse operating model of the acquisition channel;

it further comprises a compensation phase including the following steps: the digital signal delivered by the acquisition channel is converted into an analog signal with compensation by the reverse operating model calibrated with the new set of parameters, and the analog signal with compensation is converted into a digital signal with compensation by the correction means.

BRIEF DESCRIPTION OF THE DRAWINGS

These features and advantages of the invention will appear more clearly upon reading the following description, provided solely as a non-limiting example, and done in reference to the appended drawings, in which.

DETAILED DESCRIPTION

Figure 1:
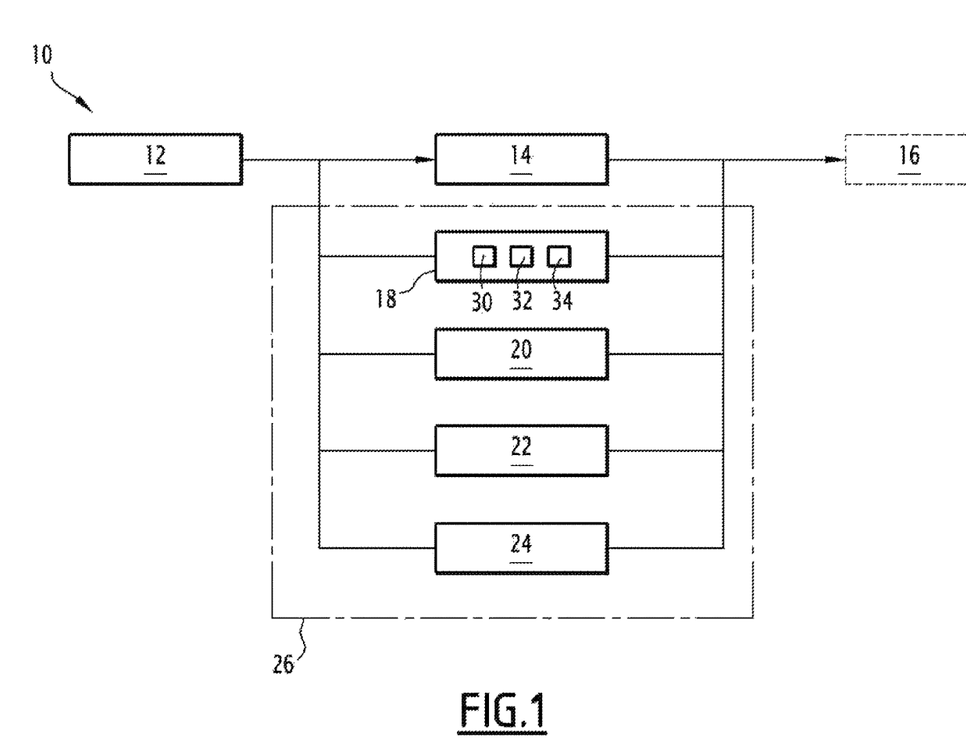
FIG. 1 is a diagrammatic view of an acquisition system according to the invention.

FIG. 1 indeed shows a system for the acquisition of at least one physical variable according to the invention. In this FIG. 1, the acquisition system is designated by general reference 10.

This acquisition system 10 is for example usable in on-board avionics systems in an aircraft. The acquisition system 10 thus meets a certain criticality level, for example criticality level DAL A.

Of course, the acquisition system 10 can be used in many other technical fields, which include the automobile, railroad, aerospace, etc. fields.

The system 10 for example includes a sensor for measuring the physical variable and able to emit an analog signal SA corresponding to the physical variable. In FIG. 1, this sensor is designated by general reference 12.

The measured physical variable is for example the temperature outside the aircraft or the position of a flight control surface. Thus, in this case, the analog signal SA for example corresponds to a resistance value emitted by the sensor 12.

The system 10 further includes an acquisition channel connected to the sensor 12 and able to receive the analog signal SA emitted by the sensor 12 to convert it into a digital signal SN. In FIG. 1, the acquisition channel is designated by general reference 14.

Thus, this digital signal SN is for example delivered to an onboard computer connected to the acquisition channel 14 and allowing suitable processing of this signal. In FIG. 1, this computer is then designated by general reference 16.

As is known in itself in the state of the art, the conversions of the analog signal SA into a digital signal SN can be done with potential losses of accuracy.

The system 10 further includes self-test means for checking the integrity of the acquisition channel 14, means for analyzing the results of this verification, means for correcting the digital signal delivered by the acquisition channel 14 and means for calibrating the self-test means.

In FIG. 1, these means are respectively designated by general references 18, 20, 22 and 24.

Furthermore, these means 18, 20, 22 and 24 are at least partially integrated into a single component designated by general reference 26 in FIG. 1.

The single component 26 is for example situated in the immediate vicinity of the sensor 12.

The self-test means 18 make it possible to verify the integrity of the acquisition channel 14 by injecting an analog reference signal $SA_R$ therein and comparing a digital test signal $SN_T$ delivered by the acquisition channel 14 and corresponding to this analog reference signal $SA_R$, with the original signal.

To that end, the self-test means 18 includes a storage unit, a computing unit and a comparison unit respectively designated by general references 30, 32 and 34 in FIG. 1.

A computing unit 32 is able to dynamically execute a reverse operating model of the acquisition channel 14 making it possible to model the operation of the acquisition channel 14 to check its integrity.

The reverse operating model is defined by a plurality of parameters from a database provided to that end and stored in the storage unit 30.

These parameters are computed dynamically by the computing unit 30 and at least partially describe the operation of the acquisition channel 14.

Thus, the reverse operating model further makes it possible to compute, from a reference digital signal $SN_R$, a reference analog signal $SA_R$, to inject this analog signal into the acquisition channel 14.

According to another alternative embodiment, the digital reference signal $SN_R$ and analog reference signal $SA_R$ pair for example comes from a database stored in the storage unit 30.

According to still another alternative embodiment, the digital reference signal $SN_R$ corresponds to a digital signal SN previously acquired by the acquisition channel 14.

The comparison unit 34 then makes it possible to compare the digital test signal $SN_T$ delivered by the acquisition channel 14 with the original digital reference signal SNR of this test signal.

The comparison unit 34 further makes it possible to generate a result of this comparison and deliver it to the analysis means 20.

This comparison result for example corresponds to losses of accuracy between the digital test signal $SN_T$ and the original digital reference signal $SN_R$ of this test signal.

Based on the result of the comparison, the analysis means 20 make it possible to determine an operating mode for the acquisition channel 14 between a normal, downgraded or failure operating mode.

Thus, in the normal operating mode, the values of the accuracy losses of the acquisition channel 14 belong to a first predetermined value range $[V_1, V_2]$.

In this operating mode, the losses of accuracy in the acquisition channel 14 do not affect the operation of the system 10.

In the downgraded operating mode, the values of the accuracy losses of the acquisition channel 14 belong to a second predetermined value range $]V_2, V_3]$.

Each value of the second range $]V_2, V_3]$ is greater than each value of the first range $[V_1, V_2]$ and less than each value of a third predetermined value range $]V_3, V_4]$.

Thus, in this operating mode, the losses of accuracy in the acquisition channel 14 affect the operation of the system 10, but are tolerated.

Lastly, in the failure operating mode, the values of the accuracy losses of the acquisition channel 14 belong to the third value range $]V_3, V_4]$.

This means that in the failure mode, the losses of accuracy in the acquisition channel 14 are not tolerated and the acquisition system 10 is fully recognized as having failed.

The analysis means 20 are also able to send a status signal SE to the computer 16, indicating the current operating mode of the acquisition channel 14.

When the acquisition channel 14 is in the downgraded or failure operating mode, the reverse operating model allows the correction means 22 to correct the digital signal SN delivered by the acquisition channel 14.

Furthermore, in the downgraded or failure operating mode, the learning means 24 are able to calibrate the parameters of the reverse operating model by minimizing the accuracy losses between the digital test signals $SN_T$ and the digital reference signals $SN_R$ corresponding to these test signals.

Thus, the correction means 22 are able to generate a digital signal with compensation $SN_C$ corresponding to an analog signal with compensation $SA_C$ computed from the digital signal SN delivered by the acquisition channel 14 and corrected using the recalibrated reverse operating model. This digital signal with compensation $SN_C$ is for example delivered to the computer 16.

This more particularly makes it possible to adapt these parameters to the aging of the acquisition channel 14.

One can then see that based on the results of this calibration, the analysis means 20 can change the downgraded operating mode to the normal operating mode or the failure operating mode to the downgraded operating mode.

It is also clear that the correction means 22 can correct the delivered digital signal, from parameters of the reverse operating model calibrated by the learning means 24.

A method 50 for the acquisition of at least one physical variable, implemented by the acquisition system 10, will now be explained in reference to FIGS. 2 to 5.

This method 50 comprises an acquisition phase $P_1$, a self-test phase $P_2$, a learning phase $P_3$ and a compensation phase $P_4$.

Figure 2:
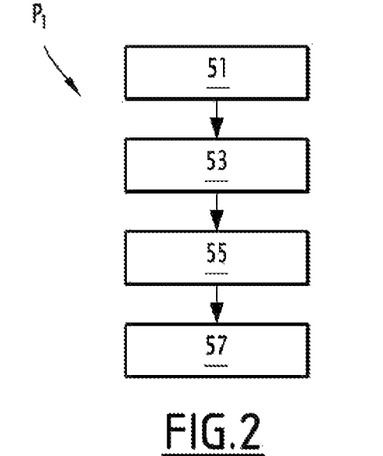
FIG. 2 is a flowchart of a phase for the acquisition of a physical variable implemented in an acquisition method according to the invention.

A flowchart of the acquisition phase $P_1$ of the method 50 is shown in FIG. 2.

Thus, according to this flowchart, during an initial step 51 of the phase $P_1$, the sensor 12 measures the physical variable and generates an analog signal SA corresponding to the measured value.

During a following step 53, the sensor 12 injects the generated analog signal SA into the acquisition channel 14.

During a following step 55, the acquisition channel 14 converts this analog signal SA into a digital signal SN.

Lastly, during a final step 57, the acquisition channel 14 delivers the converted digital signal SN to the computer 16.

Figure 3:
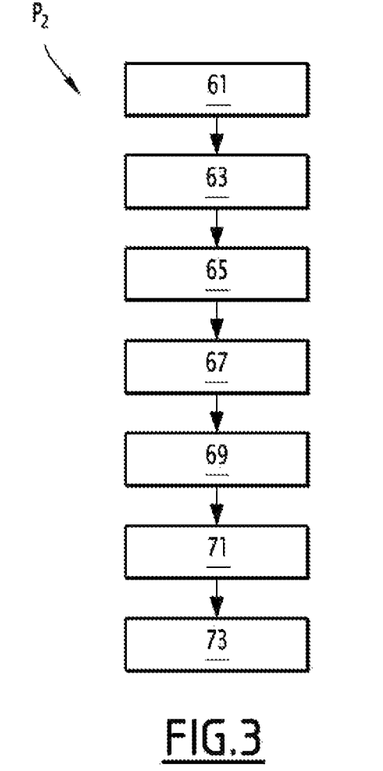
FIG. 3 is a flowchart of a self-test phase implemented in the method of FIG. 2.

A flowchart of the self-test phase $P_2$ of the method 50 is shown in FIG. 3.

Thus, according to this flowchart, during an initial step 61 of the phase $P_2$, the self-test means 18 develop a digital reference signal $SN_R$ as previously indicated.

During a following step 63, the self-test means 18 convert this digital reference signal $SN_R$ into an analog reference signal $SA_R$ by applying the reverse operating model.

During a following step 65, the self-test means 18 inject this analog reference signal $SA_R$ into the acquisition channel 14.

During a following step 67, the acquisition channel 14 converts this analog reference signal $SA_R$ into a digital test signal $SN_T$ and delivers this test signal to the self-test means 18.

During a following step 69, the self-test means 18, and in particular the comparison unit 34, compare the digital test signal $SN_T$ with the corresponding digital reference signal $SN_R$ and communicate the result of this comparison to the analysis means 20. This result for example corresponds to losses of accuracy between the two signals.

During a following step 71, the analysis means 20 determine an operating mode for the acquisition channel 14 from among the normal, downgraded or failure operating modes.

Lastly, during a final step 73, the analysis means 20 send a status signal SE indicating the current operating mode of the acquisition channel 10 to the computer 16.

Figure 4:
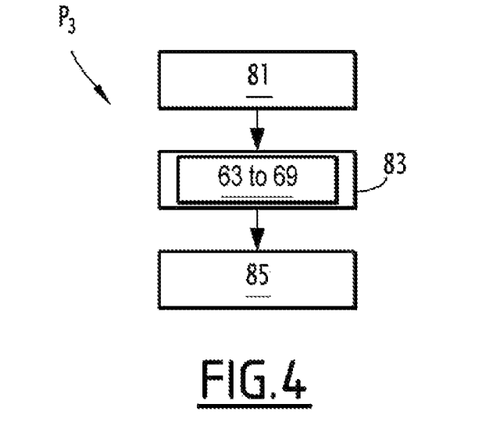
FIG. 4 is a flowchart of a learning phase implemented in the method of FIG. 2.

The learning phase $P_3$ of the method 50 can be launched after the self-test phase $P_2$.

A flowchart of the learning phase $P_3$ of the method 50 is shown in FIG. 4.

Thus, according to this flowchart, during an initial step 81 of the phase $P_3$, the learning means 24 develop a minimal digital reference signal $SN_R$ min and a maximal digital reference signal $SN_R$ max.

During a following step 83, a self-test sequence repeating steps 63 to 69 of the self-test phase $P_2$ is launched to determine the losses of accuracy on each digital reference signal $SN_R$ min and $SN_R$ max.

During a final step 85, the learning means 24 calibrate the parameters of the reverse operating model of the acquisition channel 14 to minimize the accuracy losses.

Figure 5:
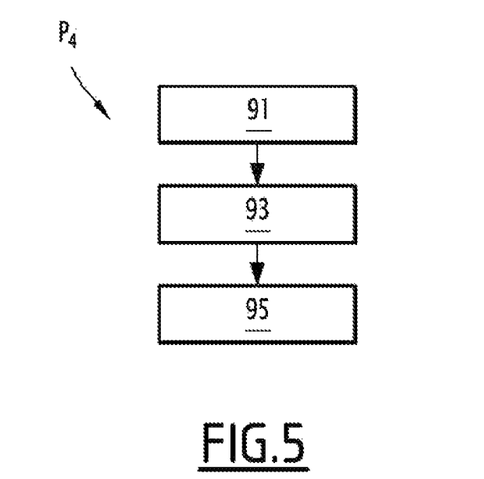
FIG. 5 is a flowchart of a compensation phase implemented in the method of FIG. 2.

The compensation phase $P_4$ of the method 50 can be launched after the learning phase $P_3$.

A flowchart of the compensation phase $P_4$ of the method 50 is shown in FIG. 5.

Thus, according to this flowchart, during an initial step 91 of phase $P_4$, the correction means 22 convert the digital signal SN delivered by the acquisition channel 14 into an analog signal with compensation $SA_C$ by the reverse operating model calibrated with the new parameters.

During a following step 93, the correction means 22 convert the analog signal with compensation $SA_C$ into a digital signal with compensation $SN_C$ by applying a normal operating model of the acquisition system with the initial parameters.

Lastly, during a final step 95, the correction means 22 deliver the digital signal with compensation $SN_C$ to the computer 16.

Figure 6:
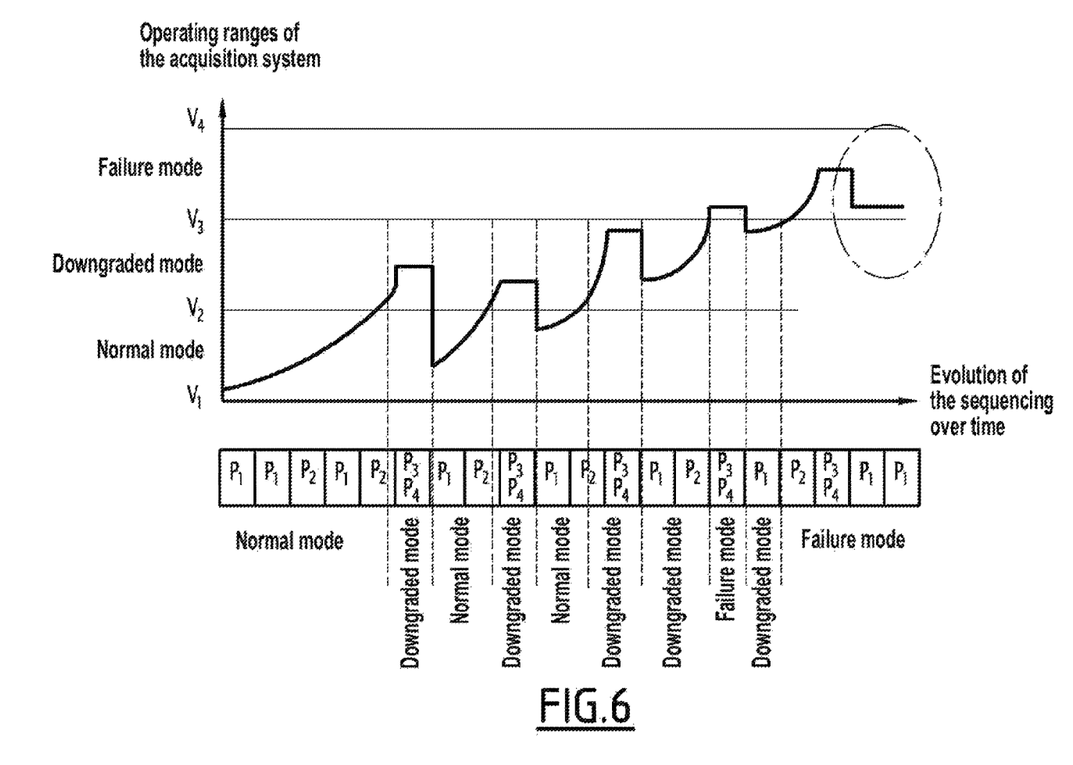
FIG. 6 is a diagram illustrating different operating modes of the system of FIG. 1 based on its aging.

A diagram illustrating the accuracy losses in the acquisition channel 14 based on the aging of the acquisition system 10 is shown in FIG. 6.

Thus, as illustrated in this FIG. 6, initially the accuracy losses are minimal and the acquisition channel 14 is in the normal operating mode.

In this operating mode, the self-test phase $P_2$ follows the acquisition phase $P_1$ to evaluate the accuracy losses.

When these losses exceed the threshold $V_2$, the analysis means 20 activate the downgraded operating mode.

In this operating mode, the learning $P_3$ and compensation $P_4$ phases are respectively launched to calibrate the parameters of the reverse operating model of the acquisition channel 14 and to correct the delivered digital signal.

If, after the learning phase $P_3$, the accuracy losses are below the threshold $V_2$, the analysis means 20 activate the normal operating mode. Otherwise, the acquisition channel 14 continues to operate in the downgraded operating mode.

When the accuracy losses exceed the threshold $V_3$, the analysis means 20 activate the failure operating mode and the learning $P_3$ and compensation $P_4$ phases are launched again.

If, after the learning phase $P_3$, the accuracy losses are below the threshold $V_3$, the analysis means 20 activate the downgraded operating mode. Otherwise, the acquisition channel 14 continues to operate in the failure operating mode and the entire system 10 is therefore recognized by the computer 16 as having failed.

Of course, other embodiments and examples of the acquisition system and the associated method can also be considered.

One can then see that the present invention has a certain number of advantages.

The acquisition system according to the invention takes into account the aging of the acquisition channel and thus adapt its self-test means.

This then makes it possible to model this acquisition system based on its actual criticality level at the beginning of its lifetime without needing to oversize it.

Thus, the acquisition system according to the invention is less bulky, simpler and more compact to operate relative to the acquisition systems of the state of the art.

Furthermore, the acquisition system according to the invention makes it possible to detect flaws in its operation effectively.

The invention claimed is:

1. A system for the acquisition of at least one physical variable, in particular for a critical on-board avionics system, of the type comprising:
    at least one sensor measuring the physical variable;
    at least one acquisition channel receiving an analog signal corresponding to the physical variable measured by the sensor and transforming this analog signal into a corresponding digital signal, at least some of these transformations being able to be carried out with loss of accuracy;
    self-test unit checking the integrity of the acquisition channel and generating a self-test result, the self-test unit comprises a computing unit able to dynamically execute a reverse operating model of the acquisition channel, the reverse operating model being defined by a plurality of parameters and allowing the signal corrector to correct the digital signal delivered by the acquisition channel when the latter is in the downgraded operating mode, wherein the parameters of the reverse operating model are computed dynamically;
    wherein the system further comprises an analyzer analyzing the self-test result in order to determine a normal, downgraded or failure operating mode of the acquisition channel, and activating the operation of a signal corrector correcting the digital signal delivered by the channel when the latter is in the downgraded operating mode.

2. The acquisition system according to claim 1, wherein in the normal operating mode, the values of the accuracy losses of the acquisition channel belong to a first predetermined value range.

3. The acquisition system according to claim 2, wherein in the downgraded operating mode, the values of the accuracy losses of the acquisition channel belong to a second predetermined value range, each value of the second range being greater than each value of the first range and less than each value of a third predetermined value range.

4. The acquisition system according to claim 3, wherein in the failure operating mode, the values of the accuracy losses of the acquisition channel belong to the third value range.

5. The acquisition system according to claim 1, wherein the acquisition system can deliver at least:
    an original digital signal corresponding to the digital signal delivered by the acquisition channel;

a status signal generated by the analyzer and indicating the current operating mode of the acquisition channel; and a digital signal with compensation generated by the signal corrector and corresponding to the digital signal delivered by the acquisition channel and corrected by the signal corrector.

6. The acquisition system according to claim 1, wherein the self-test unit further comprises a storage unit able to store a database including the parameters of the reverse operating model.

7. The acquisition system according to claim 1, wherein the reverse operating model further makes it possible to compute, for a reference digital signal, a reference analog signal, to inject it into the acquisition channel.

8. The acquisition system according to claim 7, wherein the self-test unit further comprises a comparator comparing a digital test signal delivered by the acquisition channel and corresponding to said analog reference signal injected into the acquisition channel, with said digital reference signal.

9. The acquisition system according to claim 1, wherein the self-test unit include a storage unit able to store a database including digital reference signals and analog reference signals, each digital reference signal being associated with an analog reference signal able to be injected into the acquisition channel.

10. The acquisition system according to claim 1, wherein the acquisition system further comprises a learning unit able to calibrate the parameters of the reverse operating model, in the downgraded operating mode of the acquisition channel.

11. The acquisition system according to claim 10, wherein the signal corrector is able to correct the delivered digital signal, from parameters of the reverse operating model calibrated by the learning unit.

12. The acquisition system according to claim 1, wherein the self-test unit, the analyzer, the signal corrector and the learning unit are integrated at least partially into a single component.

13. The acquisition system according to claim 12, wherein the single component is situated near the sensor.

14. A method for the acquisition of at least one physical variable, implemented by an acquisition system, comprising an acquisition phase including:
    measuring a physical variable by at least one sensor of the acquisition system;
    injecting an analog signal corresponding to the measured physical variable into at least one acquisition channel of the acquisition system;
    converting the analog signal into a digital signal by the acquisition channel; and
    delivering the digital signal,
    wherein the acquisition system includes:
        the sensor measuring the physical variable;
        the acquisition channel receiving the analog signal corresponding to the physical variable measured by the sensor and transforming this analog signal into the digital signal, at least some of these transformations being able to be carried out with loss of accuracy;
        self-test unit checking the integrity of the acquisition channel and generating a self-test result, the self-test unit comprises a computing unit able to dynamically execute a reverse operating model of the acquisition channel, the reverse operating model being defined by a plurality of parameters and allowing the signal corrector to correct the digital signal delivered by the acquisition channel when the latter is in the downgraded operating mode, wherein the parameters of the reverse operating model are computed dynamically;
        an analyzer analyzing the self-test result in order to determine a normal, downgraded or failure operating mode of the at least one acquisition channel, and activating the operation of a signal corrector correcting the digital signal delivered by the channel when the latter is in the downgraded operating mode;
        a learning unit able to calibrate the parameters of the reverse operating model, in the downgraded operating mode of the acquisition channel,
    wherein the self-test unit comprises a computing unit able to dynamically execute a reverse operating model of the acquisition channel, the reverse operating model being defined by a plurality of parameters and allowing the signal corrector to correct the digital signal delivered by the acquisition channel when the latter is in the downgraded operating mode.

15. The method according to claim 14, wherein the method further comprises a self-test phase including:
    developing a digital reference signal;
    converting the digital reference signal into an analog reference signal via the reverse operating model;
    injecting this analog reference signal into the acquisition channel;
    converting this analog reference signal into a digital test channel via the acquisition channel;
    comparing the digital test signal with the digital reference signal via the comparator; and
    determining an operating mode for the acquisition channel from among the normal, downgraded or failure operating modes.

16. The method according to claim 15, wherein the method comprises a learning phase including:
    the self-test phase is applied for a minimal digital reference signal and for a maximal digital reference signal to determine the losses of accuracy on each of these digital reference signals; and
    the learning unit calibrate a new set of parameters for the reverse operating model of the acquisition channel.

17. The method according to claim 16, wherein the method further comprises a compensation phase including:
    the digital signal delivered by the acquisition channel is converted into an analog signal with compensation by the reverse operating model calibrated with the new set of parameters; and
    the analog signal with compensation is converted into a digital signal with compensation by the signal corrector.

* * * * *